United States Patent
Vodakov et al.

(10) Patent No.: US 6,261,363 B1
(45) Date of Patent: Jul. 17, 2001

(54) TECHNIQUE FOR GROWING SILICON CARBIDE MONOCRYSTALS

(76) Inventors: Yury Alexandrovich Vodakov, ul. Reshetova 13-1-15, 194017 St. Petersburg; Evgeny Nikolaevich Mokhov, pr. Irinovsky, 21-1-225, 195279 St. Petersburg; Mark Grigorievich Ramm, br. Zagrebsky, 5-3-201, 192284 St. Petersburg; Alexandr Dmitrievich Roenkov, pr. Grazhdansky, 9-11, 195220 St. Petersburg; Yury Nikolaevich Makarov, 6-aya ul. Sovetskaya, 25/20-29, 193144 St. Petersburg; Sergei Yurievich Karpov, pr. Kultury, 24-1-44, 194292 St. Petersburg; Mark Spiridonovich Ramm, ul. Blokhina, 23-3, 197198 St. Petersburg; Leonid Iosifovich Temkin, ul. Turku, .31-176, 192241 St. Petersburg, all of (RU)

( * ) Notice: Subject to any disclaimer, the term of this patent is extended or adjusted under 35 U.S.C. 154(b) by 0 days.

(21) Appl. No.: 09/355,561
(22) PCT Filed: Jan. 22, 1997
(86) PCT No.: PCT/RU97/00005
§ 371 Date: Jul. 20, 1999
§ 102(e) Date: Jul. 20, 1999
(87) PCT Pub. No.: WO97/27350
PCT Pub. Date: Jul. 3, 1997

(51) Int. Cl.[7] .............................. C30B 23/06; C30B 29/36
(52) U.S. Cl. .......................... 117/104; 117/106; 117/107; 117/951; 423/345
(58) Field of Search ................................... 117/104, 106, 117/107, 951; 423/345

(56) References Cited

U.S. PATENT DOCUMENTS

| | | |
|---|---|---|
| 2,854,364 | 9/1958 | Lely . |
| 4,125,756 | * 11/1978 | Hierholzer et al. .................. 219/121 |
| 4,147,572 | 4/1979 | Vodakov et al. . |

(List continued on next page.)

FOREIGN PATENT DOCUMENTS

| | | |
|---|---|---|
| 3230727 | 2/1984 | (DE) . |
| 59-035099 | 2/1984 | (JP) . |
| 882247 | * 11/1996 | (RU) . |
| 403275 | 3/1970 | (SU) . |

OTHER PUBLICATIONS

Use of Ta container material for quality improvement of SiC crystals grown by the sublimation technique; D. Hoffmann, et al., International Conference on Silicon Carbide and Related Materials, 1995.

(List continued on next page.)

Primary Examiner—Robert Kunemund
(74) Attorney, Agent, or Firm—McCutchen, Doyle, Brown & Enersen; David G. Beck

(57) ABSTRACT

A sublimation technique of growing silicon carbide single crystals, comprising a parallel arrangement, opposite each other, of the evaporating surface of a silicon carbide source (1) and the growing surface of at least one seed crystal (2) of a specified politype, to define a growth zone (4), and generation of a reduced pressure and an operating temperature field with an axial gradient in the direction from the seed crystal (2) towards the source (1), providing evaporation of silicon carbide of the source (1) and vapour-phase crystallization of silicon carbide on the growing surface of the seed crystal (2). The growth zone (4) is here sealed before the operating temperatures are reached therein, and the process is run with a solid solution of tantalum and silicon carbides in tantalum and their chemical compounds present in the growth zone (4). The material of the source (1) employed for implementing the sublimation technique of growing silicon carbide crystals is silison carbide ceramics.

1 Claim, 1 Drawing Sheet

U.S. PATENT DOCUMENTS

| | | | |
|---|---|---|---|
| 4,302,508 | * 11/1981 | Hierholzer et al. | 428/367 |
| 4,556,436 | 12/1985 | Addamanio . | |
| 4,866,005 | 9/1989 | Davis et al. . | |
| 5,433,167 | 7/1995 | Furukawa . | |
| 5,964,944 | * 10/1999 | Sugiyama et al. | 117/107 |

OTHER PUBLICATIONS

Crowing of Epitaxial Layers of Silicon Carbide; E.N. Mokhov, et al.; Vysokochistie veshchestva. No. 3, 1992, pp. 98–105.

Excess phase formation during sublimation growth of silicon carbide; S. Yu. Karpov, et al.; International Conference on Silicon Carbide and Related Materials, 1995.

Electrotechnical Materials Manual; Yu. V. Koritsky, et al., 1988, p. 449.

* cited by examiner

TECHNIQUE FOR GROWING SILICON CARBIDE MONOCRYSTALS

FIELD OF THE INVENTION

The invention relates to generation of monocrystalline materials, in particular, silicon carbide, and it can be successfully used in the production of semiconductor devices based on silicon carbide. Silicon carbide (SiC) is a wideband-gap semiconductor material suitable for the development of light sources, power diodes, field-effect transistors and photodiodes showing a high stability and capable of being operated at increased temperatures. The parameters of these devices are largely controlled by the purity of the material and its structural characteristics.

BACKGROUND OF THE INVENTION

The methods most commonly used in producing SiC single crystals are sublimation techniques based on the Lely method, which are realized by vapour-phase crystallization, as a result of evaporation of solid silicon carbide (U.S. Pat. No. 2,854,364; U.S. Pat. No. 4,866,005). As shown in (S. Yu. Karpov, Yu. N. Makarov, M. S. Ramm, R. A. Talalaev "Excess Phase Formation during Sublimation Growth of Silicon Carbide". Presented at the 6th International Conference on Silicon Carbide, September, 1995, pp. 73–74, Kyoto, Japan), the SiC monocrystal growth out of vapour, without forming any secondary-phase inclusions, is only realized if the external silicon (Si) flux onto the growing surface exceeds the carbon (C) flux.

The required excess silicon flux is dependent on the temperature of the growing surface and determined, in the case of sublimation technique, by composition of the vapour adjacent said surface of growth. The conditions of the single-phase (i.e. without secondary phase inclusions) monocrystalline SiC growth are met with the vapour composition approximating the SiC—Si system (Spravochnyik po elektrotekhnicheskim materialam, Ed. by Yu. V. Koritsky, V. V. Pasynkov, B. M. Tareyev, Energoatomizdat/ Leningrad/, 1988, p.449). It has been shown by experiment that non-observance of this condition results in a sharply increased density of dislocations, channels and micropipes in the growing crystal. Since it is the silicon molecules that have the maximum concentration in the gaseous phase, any drift of the substance from the growth zone will result in the vapour phase within the growth zone being depleted of silicon, and hence enriched with carbon, thus ultimately leading to graphitization of the source, degradation of the crystal quality, discontinuation of the growth process. The shift of the vapour composition, in the growth zone, towards the vapour phase corresponding to the SiC—Si system substantially improves the growth and contributes to a more perfect structure of the SiC single crystal grown. This is due to the fact that such system (SiC—Si) prevents the secondary phase of graphite from being generated, avoiding graphitization of the source and the growing surface of the seed crystal. It is also known, however, that excessive silicone in the growth zone may results both in the formation of defects on the growing surface of the SiC crystal, due to the precipitation thereon of excess silicon drops, and in generation of polytypes differing from the seed polytype.

In the patents U.S. Pat. No. 2,854,364; DE 3,230,727, it is proposed that SiC powder of a predetermined granularity, with a mass of more than three times the mass of the single crystal to be grown, be placed in a lump, in the growth zone, in order to maintain the required vapour phase composition for a certain time, the powder serving as the source of silicon carbide vapours. In this case, a relatively constant composition of the vapour phase within the growth zone is provided, because the drift of SiC vapours into the space outside the growth zone, which might have resulted in a continuous enrichment of the vapour phase with carbon atoms, is balanced out by an abundant generation of SiC vapours, since the vapour phase is substantially more enriched with silicon atoms than with carbon atoms. This enables a relative stability of the vapour phase composition in the vicinity of the growing surface of the SiC single crystal to be maintained for a certain period of time. The duration of the stable growth process, however, is limited, and so the SiC—C system comes to be realized, with time, in most of the volume of the growth zone, which has been previously shown as being detrimental to the growth process. The large amounts of the SiC powder consumed leads to an increased cost of the grown single.

In U.S. Pat. No. 4,866,005 a technique has been proposed which allows an essentially unlimited duration of the growth process by continuously feeding specified small portions of SiC powder of a given granularity into a predetermined temperature zone of the growth chamber. However, in this case, again, the mass of the material consumed in the SiC vapour source will be much in excess of that of the single crystal grown, due to the SiC vapours being removed to the space outside the growth zone, for the growth chamber communicates with the environment, making this method, like the methods of U.S. Pat. No. 2,854,364; DE 3,230,727, uneconomical. The loss of the SiC source material is also caused by the growth zone geometry, and particularly, by a relatively large separation (about 10 cm) of the evaporating surface of the SiC vapour source and the seed growing surface, which by far exceeds the Si, Si2C, SiC2 molecule track length at the working pressure in the growth zone.

The method most closely approximating that herein proposed is the sublimation technique of growing SiC single crystals, as disclosed in the patent U.S. Pat. No. 4,147,572 (the so-called "sandwich-method"). According to this disclosure, the evaporating surface of the SiC source and the growing surface of the SiC seed crystal are arranged in parallel, at the distance not exceeding 0.2 of the maximum linear dimension of the source, to form the growth zone. The single crystals are grown in a graphite crucible in an inert gas atmosphere, at temperatures of 1600 to 2000° C., with an axial thermal gradient of 5 to 200° C./cm, in the direction from the seed crystal to the source. With small gaps between the SiC source and the seed crystal, the loss of SiC vapours from the growth zone can be substantially reduced and their flow directed along the straight path from the source to the growing surface of the seed crystal. The growth zone is here screened from external impurity sources, resulting in a reduced concentration of impurities in the single crystal grown. In addition, the small gap between the evaporating surface of the source and the growing surface of the seed, in comparison to the size of the SiC source, allows a uniform temperature along their surfaces to be maintained and the temperature difference between them controlled.

This method suffers from a number of drawbacks. One of them is the small volume of the single crystals grown (less than 1 mm thick) due to a sharp drop in the growth rate, as the crystallization time increases, as a result of the silicon at the edge of the growth zone being volatilized beyond its bounds and consequently, excessive carbon released from the evaporating surface of the SiC source and the growing surface of the grown crystal, slowing down the growth process. In this case, the single crystals obtained by the above technique show defects such as secondary-phase inclusions (predominantly, graphite), micropipes with a density of more than 100 per cm$^2$ and dislocations numbering at least 10$^{-4}$ per cm$^2$. They are also relatively inferior, as regards the concentration of residual impurities such as boron, oxigen, etc.

Known in the art is a favourable effect of tantalum (Ta) on the growth of monocrystalline SiC. In particular, theoretical investigations of the sublimation growth of monocrystalline SiC with a "sandwich-cell" in a tantalum container have shown that the vapour medium produced in the growth zone is close to the SiC—Si system with the partial silicon vapour pressure slightly exceeding the pressure in the SiC—Si system (D. Hofmann, S. Yu. Karpov, Yu. N. Makarov, E. N. Mokhov, M. S. Ramm, A. D. Roencov, Yu. A. Vodakov, "The Use of Tantalum Container Material for Quality Improvement of SiC Crystals Grown by the Sublimation Technique" Presented at the 6th International Conference on Silicon Carbide, September, 1995, p.15, Kyoto, Japan). Here, the favourable effect of tantalum is made evident when the process is run both in the inert gas atmosphere and in vacuum.

It was found by the authors, however, that at an early stage of the growth process, tantalum or its compounds may be extracted as secondary-phase inclusions, and an increased concentration of dissolved tantalum in the monocrystalline SiC being grown may occur, whose presence as a dopant in the single crystal is not desirable. And even in the presence of tantalum, with more than 5-hour duration of the growth process run in accordance with the above technique, the quality of the single crystal grown is gradually impaired by the embedment of carbon dust deposited on the growing crystal. The latter circumstance is caused by the aforementioned mechanism of carbon enrichment of the vapour phase due to silicon drift to the outside of the growth zone. This is accompanied by losses of the source material amounting to 15–20% of the weight of the substance transferred.

Further, at the initial stage of the growth process, the silicon vapours formed in evaporating the SiC source may interact with the material of the tantalum container, resulting in the formation of a low-melting-point tantalum-silicon alloy and, as a consequence, in the destruction of the container at the working temperatures of the growth.

In known sublimation methods of growing silicon carbide single crystals, the SiC vapour source may be either a silicon carbide powder of the specified dispersity, presynthesized from a spectrally pure silicon/graphite mixture, or a poly- or monocrystalline SiC wafer produced, for example, by the Lely method (E. N. Mokhov, M. G. Ramm, Yu. A. Vodakov "Vyrashchivanie epitaksialnykh sloev karbida kremnia". Vysokochistie veshchestva. No.3, 1992, pp. 98–105). In this case, in order to obtain a large amount of the grown single crystals, the SiC vapour source is required to be continuously fed to the growth area. The use of silicon carbide powder as the SiC source is more economical than that of poly- or monocrystalline silicon carbide, which is much more expensive than the powder. The continuous supply of the powder into the growth zone, however, is rather a complicated problem.

In addition, as the SiC powder is synthesized, coarse-sized impurities such as graphite or other dust are generally entrapped by the SiC powder grains. As the SiC single crystals grow, dust is transported to the growing surfaces along with SiC molecules, substantially impairing the perfection of monocrystalline structure and resulting in a high density of micropipes and dislocations in the crystal grown. Thus, the quality of the grown silicon carbide may be insufficient to serve as the basis for semiconductor devices.

The nearest analogy to the proposed invention is the use of silicon carbide poly- or monocrystals as the SiC source (U.S. Pat. No. 4,147,572). As such SiC sources are free from coarse-grained impurities, higher-quality SiC single crystals result. As was mentioned above, however, the poly- or monocrystals of silicon carbide are rather expensive, making their use as the SiC source uneconomical.

DISCLOSURE OF THE INVENTION

It is the object of the invention to provide a sublimation technique of growing silicon carbide single crystals and silicon carbide source for implementing said technique such that in the growth zone, with the minimum amount of foreign impurities and the minimum losses of the source material, a composition of silicon carbide vapours optimized for the crystal growth be maintained for a specified period of time, which would correspond to the SiC—Si system, thereby ensuring a cost-effective production of high quality single crystals of a desired size.

With this object in view, in the sublimation technique of growing silicon carbide single crystals, comprising an arrangement in parallel, opposite each other, of the evaporating surface of the silicon carbide source and the growing surface of at least one silicon carbide seed crystal of a given polytype, serving to define a growth zone, and the development, within the growth zone, of a reduced pressure and a working temperature field with an axial gradient in the direction from the seed crystal to the source, providing evaporation of silicon carbide of the source and its vapour-phase crystallization on the growing surface of the seed, according to the invention, the growth zone is sealed before the working temperatures have been reached therein, the process being run with a solid solution of tantalum and silicon carbides in tantalum present in the growth zone, as well as their chemical compounds.

It has been established by the authors theoretically and verified by experiment that as a result of vacuum-tight isolation of the growth zone from the rest of the space, the losses of the source material are substantially reduced (down to several percent), while the presence of the solid solution of tantalum and silicon carbides in tantalum and of their chemical compounds in the growth zone, i.e. a variable-composition Ta—Si—C compound acting as the catalyst, causes the vapour-phase composition to be shifted from the SiC—C system to the SiC—Si system. This variable-composition Ta—Si—C compound remains unchanged for an extended period of time, whereby a stable composition of the vapour phase in the growth zone is provided, thus improving the quality and increasing the size of the single crystals grown. In addition, the isolation of the growth zone from the environment contributes to a reduction of impurity concentration in the grown snigle crystal. Furthermore, a parallel arrangement of the evaporating surface of the SiC source and the growing surface of the seed, as well as the axial temperature gradient, provide, as shown in SU, A, 403275, a short cut from the source to the seed crystal, enabling the losses of the source material due to precipitation of silicon carbide vapours outside the growing surface of the seed to be reduced, the uniform temperatures along the evaporating surface of the source and the growing surface of the seed to be maintained, and the temperature difference between these surfaces controlled.

It is preferable that the SiC source and at least one seed crystal be placed in a sealable container, the material of its inner surface representing a solid solution of tantalum and silicon carbides in tantalum and their chemical compounds, the container volume being preferably limited by the plane of attachment of the seed crystal, and from the sides, defined by the periphery of the growth zone and the source.

Location of the SiC source and the SiC seeds in a container adapted to be sealed and fabrication of the inner surface of the walls from the above material combine to provide the most technologically efficient method of sealing the growth zone and introducing a solid solution of tantalum and silicon carbides in tantalum and their chemical compounds into the zone. The above geometry of the container defining the growth zone is optimum for minimizing source material losses.

It is preferable, when growing SiC single crystals of the 4H polytype, with the 4H polytype crystal used as the seed, that tin vapours be added to the growth zone.

It is known that when growing silicon carbide single crystals of the 4H polytype, they are very likely to be transformed, spontaneously, into the 3C polytype. According to the authors' findings, the tin vapours present in the growth zone of the 4H polytype monocrystalline SiC contributes to a stable reproduction of the 4H polytype of the seed crystal.

The aim is also attained, according to the invention, by selecting silicone carbide ceramics as the SiC source for the sublimation technique of growing single crystals, in the form of a solid SiC material.

The use of silicon carbide ceramics as the source of silicon carbide compares favourably with SiC poly- and monocrystals, providing a more economical method of crystal growth, since the manufacturing cost of SiC ceramics is much lower than that of producing SiC poly- and monocrystals. In this case, also, the quality of the grown SiC crystals can be improved as compared to using SiC powder as the source, which is due to a reduced dust component content of the SiC ceramics. Moreover, when fabricating ceramics, all the necessary additional components can be readily introduced into the SiC source, i.e. doping agents or alloying additives, thereby improving the SiC crystal growth process.

As the SiC single crystal grows, it is easier to provide a continuous supply of the SiC source, necessary for the long-lasting process of growth, in the form of a ceramic rod, rather than powder.

It is advisable that the SiC ceramics concerned be fabricated by sintering the powder at a temperature providing a partial oversublimation of SiC grains, whereby a still more thorough cleaning of the source from foreign impurities is achieved. The silicon carbide powder sintering with a partial oversublimation of SiC grains is accompanied by removal of basic background impurities and dust components from the powder, as well as its partial binding. Dense sintering prevents the dust composition being freely transferred from the evaporating surface of the source to the vapor phase, thus reducing concentration of dust components and other impurities in the growth zone.

BRIEF DESCRIPTION OF THE FIGURES IN THE DRAWINGS

The invention is further illustrated by the description of its embodiment with reference to the accompanying drawings in which.

PREFERRED EMBODIMENT OF THE INVENTION

Figure 1:
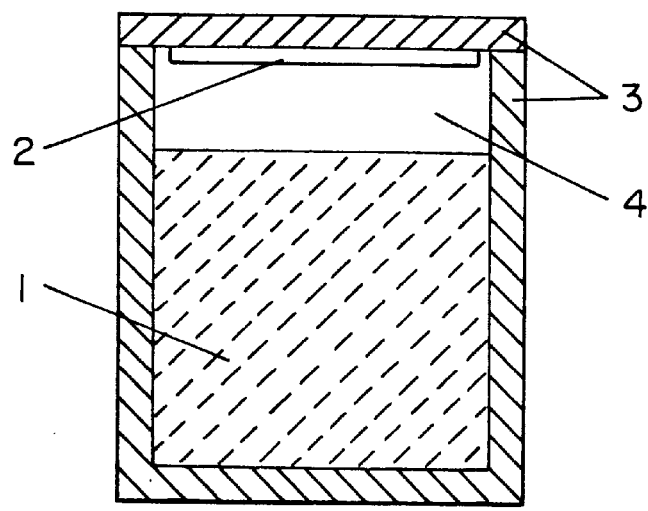
FIG. 1 represents a container with the growth zone enclosed therein.

According to the invention, the crystal growth process is as follows. A silicon carbide source 1 (FIG. 1) and a silicon carbide seed crystal 2 of a specified polytype are placed in a container 3 with the evaporating surface of the source 1 and the growing surface of the seed 2 arranged in parallel with respect to each other, to define the growth zone 4. If several seed crystals 2 (FIG. 2) are to be used, their growing surfaces are positioned in the same plane in parallel to the evaporating surface of the source 1. The number of seed crystals 2 in the growth zone 4 is determined by the specific task.

The distance between the evaporating surface of the source 1 and the growing surface of the seed crystal 2 should not be much in excess of the SiC molecule track length, in order to prevent the molecule diffusion which might reduce the single crystal growth rate and to avoid the loss of the SiC source material due to its vapours being precipitated outside the growing surfaces of the seed crystals.

The most cost-effective material employed for the SiC source 1 is silicon carbide ceramics produced by a technique such as sintering SiC powder at a temperature permitting a partial oversublimation of SiC grains. The SiC powder sintering may be carried out in an environment such as inert gas, particularly argon, atmosphere, within a temperature range of 1500 to 2300° C.

The powder sintering with a partial oversublimation of SiC grains is accompanied by removing basic background impurities and dust composition from the powder, as well as by its partial binding. In this case, dense sintering prevents the dust composition being transferred from the evaporating surface of the source 1 to the vapour phase. The ceramics may also be fabricated by compression of the SiC powder.

Further, in the ceramics fabrication process, a doping agent may be deliberately introduced into the SiC ceramics, in a specified proportion, to obtain the desired doping of the grown SiC single crystal. It will be noted that uniform distribution of the dopant over the entire volume of SiC ceramics, during its fabrication, presents no difficulties, resulting in uniformly doped high-grade single crystals.

In another embodiment of the method, a SiC poly- or monocrystal may be used as the source. Such embodiment, however, will be less economical.

As shown in FIG. 1, the SiC source 1 may be placed directly on the bottom of the container 3 and the seed crystal 2 mounted on its top cover. From the sides, the container 3 defines, along the periphery, the SiC source 1 and hence, the growth zone 4.

Figure 2:
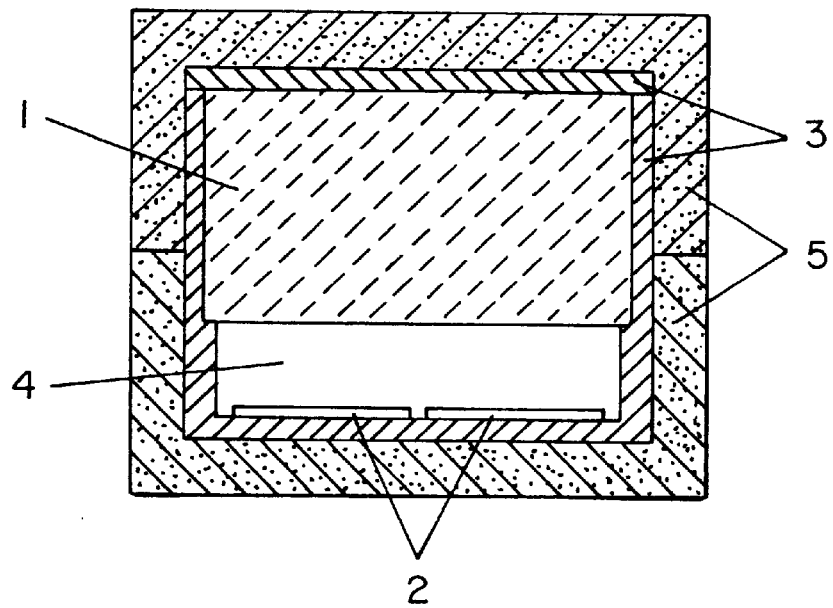
FIG. 2 represents a container with the growth zone enclosed therein, which is placed inside a sealing case.

Alternatively, as shown in FIG. 2, the SiC source 1 may be mounted at the top of the container 3 (on its cover), and the SiC seeds 2 located on the bottom of the container.

Other types of mounting the source 1 and the seed crystal 2 are likewise possible. In order to prevent the losses of the SiC source material due to precipitation of SiC vapours outside the growing surfaces of the monocrystalline seeds, the inner space of the container 3 may not too much exceed the volume of the growth zone 4. The container 3 is made of tantalum, the material of the inner surface of the container 3 being a solid solution of tantalum and silicon carbides in tantalum and their chemical compounds.

In order to produce said material for the inner surfaces of the container walls, these surfaces are subjected, prior to use, to a special treatment called "composite alloying". The container is first heated in the graphite powder, gradually increasing the temperature up to 2200–2500° C., and allowed to stay for 1 to 3 hours. This is followed by gradually heating the container, in the presence of silicon carbide, to a temperature of 2500° C. an allowing it to stay for 1 to 3 hours. It has been established by the authors that as a result of such processing, the tantalum container exhibiting a depth-variable composition of Ta—Si—C is no longer capable of absorbing SiC vapours, as the monocrystalline silicon carbide is grown, acquiring the properties of a catalyst that maintains a vapour-phase composition corresponding to the SiC—Si system. Besides, the resulting variable composition Ta—Si—C compound is a refractory material withstanding the operating temperatures in growing the SiC single crystal.

Alternative methods of carbon and silicon doping of the container are possible. The container 3 is capable of being evacuated and sealed. It is possible to provide different designs of the container to permit its evacuation and sealing, a graphite sealing case 5 (FIG. 2) enclosing the container 3 may also be used for its sealing.

The container 3 (FIG. 1) including the SiC source 1 and the seed crystal 2, with their surfaces defining the growth zone 4, is placed inside the high temperature oven for growing single crystals (not shown in the drawing), allowing generation, in the growth zone 4, of a field of operating temperatures with an axial gradient directed from the seed 2 to the source 1, providing evaporation of the silicon carbide of the source 1 and vapour phase crystallization of silicon carbide on the growing surface of the seed 2. A reduced pressure (not above $10^{-5}$ Torr) is developed in the oven, and the source 1 and the seed crystal 2 are both heated to produce the operating temperatures in the growth zone 4. In this case, the container 3 is sealed before the operating temperatures have been reached in the growth zone 4. Depending on the design of the container 3, different sealing methods may be employed, such as vacuum welding. The container 3 may also be evacuated and hermetically sealed prior to placement in the high-temperature oven. In the event of using the sealing case 5 (FIG. 2) its sealing may also be realized either directly in the oven or prior to the placement of the container 3 to the oven (depending on the design of the sealing case 5).

In case of an extended process, for example, when growing large-sized single crystals, a gradual increase of the thickness of the growing single crystal occurs, with the corresponding decrease of the thickness of the source 1. In order to maintain the growth process, it is most convenient to use a ceramic SiC rod as the source 1, which is continuously fed into the growth zone 4. It is important to keep a stable temperature regime within the growth zone throughout the process. This can be accomplished by different methods, namely: by separately heating the source 1 and the seed crystal 2, and by moving the container inside the oven in accordance with the predetermined growth rate controlled by the selected temperature regime which provides the specified thermal gradient.

It has been theoretically found and experimentally verified by the authors that the vacuum-tight isolation of the growth zone 4 from the rest of the high-temperature oven space, prior to initiation of the sublimation process, substantially reduces the material losses from the source 1 (down to several percent) and prevents the leak of foreign impurities from the environment into the growth zone 4. The presence of a solid solution of tantalum and silicon carbides in tantalum and their chemical compounds, i.e. a variable-composition Ta—Si—C compound acting as the catalyst, in the growth zone 4 isolated from the environment shifts the vapour phase composition from SiC—C to SiC—Si system. Said variable Ta—Si—C compound remains unchanged for an extended period of time, whereby a stable composition of the vapour phase in the growth zone 4 is ensured, resulting in the better-quality and larger-sized single crystals grown.

When growing a SiC crystal of the 4H polytype, a single crystal of this particular polytype is used as the seed 2 and the process of growth is carried on in the presence of tin vapours which had been introduced into the container 3 prior to its sealing. In this case, a good reproducibility of the 4H seed polytype is guaranteed.

Given below are specific examples of implementing the proposed technique, illustrating its advantages, as far as the good quality and size of the resulting single crystals is concerned. It is to be understood, that this invention may be variously otherwise embodied within the scope of the claims.

The SiC single crystals were grown, using the aforementioned technique, under the conditions as follows:

| | |
|---|---|
| Distance between the evaporating surface of source 1 and the growing surface of seed 2 | 3–9 mm |
| Operating temperatures | 1800–2200 ° C. |
| Axial temperature gradient | 20–25 deg/cm |
| Growth rate | 0.7–1.2 mm/hr |

Seed crystal polytype:

| |
|---|
| 6H SiC in growing direction [0001] Si |
| 4H SiC in growing direction [0001] C |
| 6H SiC in a direction lying at an angle of 5 degrees to firection [0001]. |

The grown single crystals had the following characteristics:

| | |
|---|---|
| Single crystal layer thickness | 10 mm |
| Single-crystal diameter | 20–40 mm |
| Density of dislocations (depending on doping) | $10^2$–$10^4$ cm$^{-2}$ |
| Density micropipes, not exceeding | 10 cm$^{-2}$ |
| Density of secondary-phase inclusions (carbon, silicon) | 10 cm$^{-3}$ |

Concentration of background impurities (cm$^{-3}$):

| | |
|---|---|
| nitrogen | $10^{16}$ |
| boron | $10^{16}$ |
| tantalum | $10^{16}$–$10^{17}$ |
| Graphization of the source and the growing surface during 10 hour long process, at 2000 ° C. and a reduced pressure of $10^{-5}$ Torr | none |
| Source material loss | 5–10% |

Seed polytype reproducibility:

| | |
|---|---|
| 6H SiC polytype in growing direction [0001] Si | 80% |
| 4H SiC polytype in growing direction [0001] C | 70% |
| 6H SiC polytype at an angle of 5 deg. to direction [0001] | 100% |
| Electric power consumption per 1 g of grown SiC crystal (for the diameters of the resulting single crystals 40 and 20 mm, respectively) | 2–5 kW-hr |

Thus, the above characteristics show that the proposed method of growing SiC single crystals allows the growth of quality single crystals for an extended period of time, essentially without decreasing the growth rate.

INDUSTRIAL APPLICATION

The proposed sublimation technique of growing SiC single crystals and the SiC source for its implementation can be successfully used for fabricating SiC-based semiconductor devices with their parameters largely determined by the purity of the source material and, in particular, to manufacture devices such as light sources, power diodes, field-effect transistors, photodiodes, all showing stable characteristics at increased temperatures.

What is claimed is:

1. A method of producing 4H polytype silicon carbide crystals, the method comprising the steps of:

locating a silicon carbide source within a container, wherein an inner surface of said container is comprised of a Ta—Si—C compound;

locating at least one 4H polytype seed crystal within said container, wherein a growing surface of said at least one seed crystal is substantially parallel to an evaporating surface of said silicon carbide source;

introducing tin vapors into a growth zone defined by said silicon carbide source and said at least one 4H polytype seed crystal;

sealing said container prior to initiating a sublimation process, wherein said sealed container is substantially vacuum tight; and heating said container, wherein an axial temperature gradient in a direction from said at least one seed crystal to said silicon carbide source is formed.

* * * * *